(12) United States Patent
Iino et al.

(10) Patent No.: US 8,791,523 B2
(45) Date of Patent: Jul. 29, 2014

(54) NONVOLATILE SEMICONDUCTOR STORAGE DEVICE AND METHOD FOR MANUFACTURING SAME

(75) Inventors: Hiromitsu Iino, Mie-ken (JP); Tadashi Iguchi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 189 days.

(21) Appl. No.: 13/422,000

(22) Filed: Mar. 16, 2012

(65) Prior Publication Data
US 2013/0056818 A1 Mar. 7, 2013

(30) Foreign Application Priority Data

Sep. 1, 2011 (JP) ................. 2011-190887

(51) Int. Cl.
*H01L 21/336* (2006.01)
*H01L 29/792* (2006.01)

(52) U.S. Cl.
USPC .............. 257/324; 438/261; 257/E29.309; 257/E21.423

(58) Field of Classification Search
CPC ............ H01L 27/11551; H01L 27/11531; H01L 27/11526; H01L 29/42324; H01L 29/66825; H01L 21/8239
USPC .......... 257/324, E29.309, E21.423; 438/261, 438/264
See application file for complete search history.

(56) References Cited

U.S. PATENT DOCUMENTS

| 2007/0143035 | A1 | 6/2007 | Petruno |
| 2009/0242967 | A1* | 10/2009 | Katsumata et al. ........... 257/324 |
| 2010/0090286 | A1* | 4/2010 | Lee et al. .................... 257/368 |
| 2010/0207186 | A1 | 8/2010 | Higashi et al. |
| 2010/0213526 | A1* | 8/2010 | Wada et al. ................... 257/314 |
| 2010/0327339 | A1 | 12/2010 | Tanaka et al. |

FOREIGN PATENT DOCUMENTS

| JP | 2007-171185 | 7/2007 |
| JP | 2010-192646 | 9/2010 |
| JP | 2011-9328 | 1/2011 |
| JP | 2011-35237 | 2/2011 |

OTHER PUBLICATIONS

Japanese Office Action issued Jan. 29, 2014, in Japan Patent Application No. 2011-190887 (with English translation).

* cited by examiner

*Primary Examiner* — Steven J Fulk
(74) *Attorney, Agent, or Firm* — Oblon, Spivak, McClelland, Maier & Neustadt, L.L.P.

(57) ABSTRACT

A nonvolatile semiconductor storage device includes: a structural body; semiconductor layers; a memory film; a connecting member; and a conductive member. The structural body is provided above a memory region of a substrate including the memory region and a non-memory region, and includes electrode films stacked along a first axis perpendicular to a major surface of the substrate. The semiconductor layers penetrate through the structural body along the first axis. The memory film is provided between the electrode films and the semiconductor layer. The connecting member is provided between the substrate and the structural body and connected to respective end portions of two adjacent ones of the semiconductor layers. The conductive member is provided between the substrate and the connecting member, extends from the memory region to the non-memory region, includes a recess provided above the non-memory region, and includes a first silicide portion provided in the recess.

20 Claims, 15 Drawing Sheets

US 8,791,523 B2

NONVOLATILE SEMICONDUCTOR STORAGE DEVICE AND METHOD FOR MANUFACTURING SAME

CROSS-REFERENCE TO RELATED APPLICATIONS

This application is based upon and claims the benefit of priority from the prior Japanese Patent Application No. 2011-190887, filed on Sep. 1, 2011; the entire contents of which are incorporated herein by reference.

FIELD

Embodiments described herein relate generally to a nonvolatile semiconductor storage device and a method for manufacturing same.

BACKGROUND

Recently, a three-dimensionally stacked nonvolatile semiconductor storage device has been proposed in which multilayer conductive films are collectively processed to increase the memory storage capacity. This nonvolatile semiconductor storage device includes a structural body with insulating films and electrode films alternately stacked therein, silicon pillars penetrating through the structural body, and a memory film between the silicon pillar and the electrode film. In this structure, a memory cell is formed at the intersection between the silicon pillar and each electrode film. A connecting member is provided at both end portions of two adjacent silicon pillars to constitute a U-shaped memory string.

In such a three-dimensionally stacked nonvolatile semiconductor storage device, improvement in the controllability of memory cells is desired.

DETAILED DESCRIPTION

Figure 1:
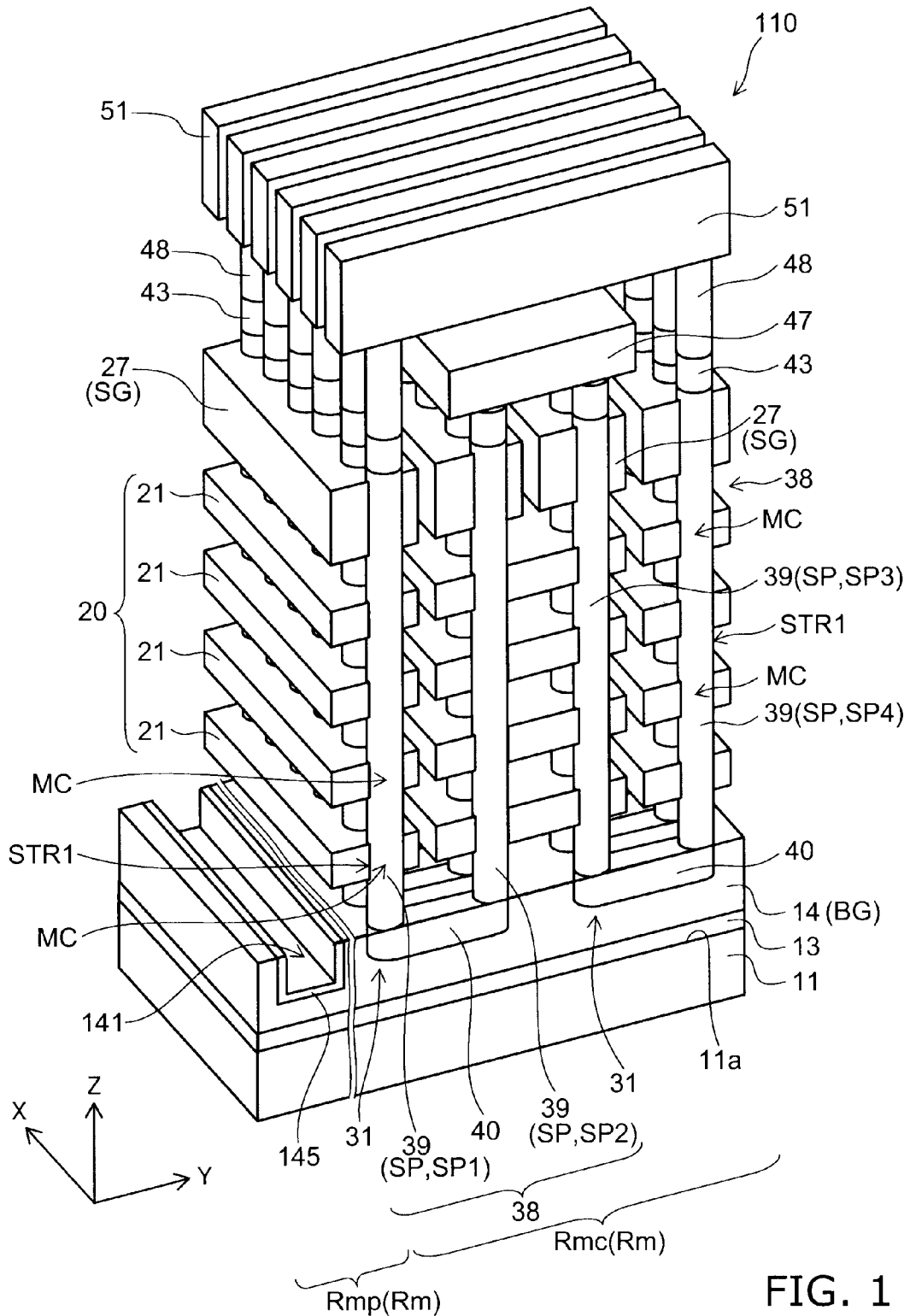
FIG. 1 is a schematic perspective view illustrating the configuration of a nonvolatile semiconductor storage device according to an embodiment.

In general, according to one embodiment, a nonvolatile semiconductor storage device includes: a structural body provided above a memory region of a substrate including the memory region and a non-memory region, the structural body including a plurality of electrode films stacked along a first axis perpendicular to a major surface of the substrate; a plurality of semiconductor layers penetrating through the structural body along the first axis; a memory film provided between the plurality of electrode films and the semiconductor layer; a connecting member provided between the substrate and the structural body and connected to respective end portions of two adjacent ones of the semiconductor layers; and a conductive member provided between the substrate and the connecting member, extending from the memory region to the non-memory region, including a recess provided above the non-memory region, and including a first silicide portion provided in the recess.

In general, according to another embodiment, a method for manufacturing a nonvolatile semiconductor storage device includes: forming a conductive member along a major surface of a substrate and forming a connecting member via an insulating film above the conductive member; forming a structural body above the conductive member and the connecting member by stacking a plurality of electrode films along a first axis perpendicular to the major surface; forming a plurality of semiconductor layers penetrating through the structural body along the first axis, and forming a memory film between the plurality of electrode films and the semiconductor layer; forming a staircase portion by shaping part of the plurality of electrode films into a staircase pattern, and forming a recess in a portion of the conductive member extending outside the staircase portion in forming the staircase portion; and forming a first silicide portion in the recess.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

(First Embodiment)

FIG. 1 is a schematic perspective view illustrating the configuration of a nonvolatile semiconductor storage device according to the embodiment.

In FIG. 1, for clarity of illustration, part of the insulating portion is not shown.

Figure 2:
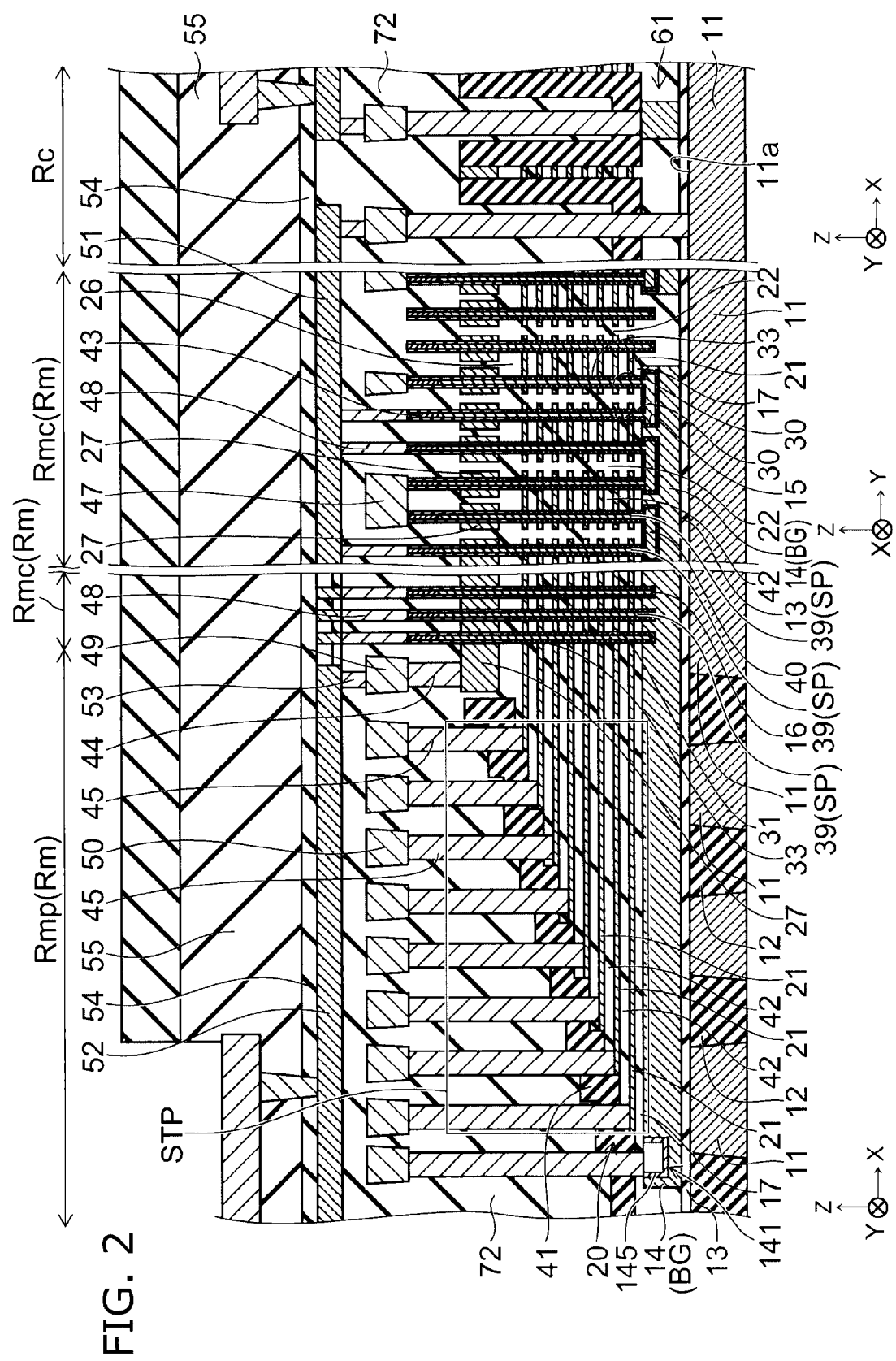
FIG. 2 is a schematic sectional view illustrating the configuration of the nonvolatile semiconductor storage device according to the embodiment.

FIG. 2 is a schematic sectional view illustrating the configuration of the nonvolatile semiconductor storage device according to the embodiment.

FIG. 2 shows the end portion Rmp of the memory array region Rm, the central portion Rmc of the memory array region Rm, and the peripheral circuit region Rc.

Figure 3:
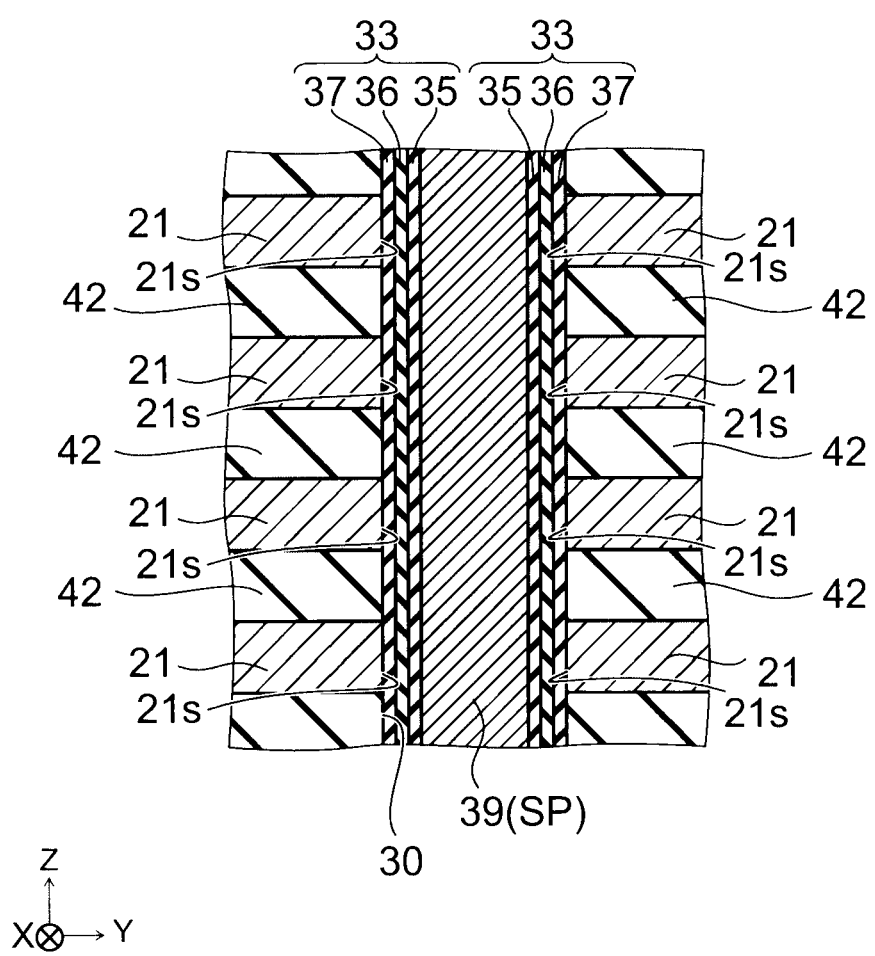
FIG. 3 is a schematic enlarged view illustrating a memory film.

FIG. 3 is a schematic enlarged view illustrating the memory film.

As shown in FIG. 1, the nonvolatile semiconductor storage device 110 includes a structural body 20, a plurality of semiconductor layers 39, a memory film 33, a connecting member 40, and a conductive member 14.

In this description, the axis orthogonal to the major surface 11a of the substrate 11 is defined as Z axis (first axis). One of the axes orthogonal to the Z axis is defined as X axis (second axis). The other of the axes orthogonal to the Z axis and also orthogonal to the X axis is defined as Y axis (third axis).

The direction away from the major surface 11a of the substrate 11 along the Z axis is referred to by using such terms as upward, upper side, above, and top. The opposite direction is referred to by using such terms as downward, lower side, below, and bottom.

The substrate 11 includes a memory array region Rm and a peripheral circuit region Rc. The memory array region Rm includes a central portion Rmc serving as a memory region, and an end portion Rmp serving as a non-memory region. The structural body 20 is provided above the memory region of the substrate 11. The structural body 20 includes a plurality of electrode films 21 provided above the major surface 11a of the substrate 11. The plurality of electrode films 21 are stacked along the Z axis. In the structural body 20 shown in FIG. 2, eight electrode films 21 are stacked. However, for convenience of description, FIG. 1 shows a structural body 20 in which four electrode films 21 are stacked. In the nonvolatile semiconductor storage device 110, the number of stacked electrode films 21 is not limited. The electrode film 21 is e.g. a word line.

The semiconductor pillar SP penetrates through the structural body 20 along the Z axis. A plurality of semiconductor pillars SP are provided like a matrix along the X and Y axes. The semiconductor pillar SP includes a semiconductor layer 39. The semiconductor layer 39 is opposed to the side surface 21s (see FIG. 3) of the plurality of electrode films 21.

The semiconductor layer 39 is provided like e.g. a column along the Z axis to constitute a semiconductor pillar SP. The semiconductor pillar SP has e.g. a solid structure made of a semiconductor material. The semiconductor pillar SP may have a hollow structure made of a semiconductor material. The semiconductor pillar SP may have a structure including e.g. an insulating layer inside a hollow structure.

As shown in FIGS. 2 and 3, the memory film 33 is provided between each side surface 21s of the plurality of electrode films 21 and the semiconductor layer 39 of the semiconductor pillar SP. A memory cell transistor is formed from the memory film 33 provided at the intersection position of the side surface 21s of the electrode film 21 and the semiconductor layer 39. The memory cell transistors are arranged like a three-dimensional matrix. By accumulating charge in its storage layer (charge accumulation film 36), each memory cell transistor functions as a memory cell MC for storing information (data).

The connecting member 40 is provided between the substrate 11 and the structural body 20. The connecting member 40 is connected to the respective end portions of two semiconductor pillars SP adjacent along the Y axis. The U-shaped pillar 38 includes two semiconductor pillars SP and the connecting member 40 connecting them. A plurality of memory cells MC are located along the two semiconductor pillars SP included in the U-shaped pillar 38. One memory string STR1 includes one U-shaped pillar 38 and a plurality of memory cells MC provided in this U-shaped pillar 38. Above the substrate 11, a plurality of memory strings STR1 are arranged like a matrix.

The conductive member 14 is provided between the substrate 11 and the connecting member 40. The conductive member 14 extends from the central portion Rmc to the end portion Rmp. The conductive member 14 is used as a back gate electrode BG. The conductive member 14 includes a recess 141 provided above the end portion Rmp. The recess 141 is juxtaposed with the structural body 20 as viewed along the Z axis in the surface of the conductive member 14. The conductive member 14 includes a first silicide portion 145 provided in the recess 141.

The conductive member 14 is made of e.g. silicon doped with phosphorus (phosphorus-doped silicon). The first silicide portion 145 includes an alloy made of e.g. at least one metal selected from nickel (Ni), cobalt (Co), and titanium (Ti), and the silicon contained in the material of the conductive member 14.

The conductive member 14 thus includes the first silicide portion 145. Hence, the electrical resistance of the back gate electrode BG being the conductive member 14 is made lower than that in the case of not including the first silicide portion 145. Thus, the controllability of the memory cells MC by the back gate electrode BG is improved.

Next, a specific example of the nonvolatile semiconductor storage device 110 is described.

The substrate 11 is made of e.g. silicon. In the embodiment, an example of using a substrate 11 made of silicon is described.

As shown in FIG. 2, in the memory array region Rm, a silicon oxide film 13 is formed above the substrate 11. Above the silicon oxide film 13, a conductive member 14 constituting a back gate electrode BG is provided.

In the central portion Rmc of the memory array region Rm, in the upper portion of the conductive member 14, a plurality of recesses 15 extending in the Y-axis direction are formed. On the inner surface of the recess 15, for instance, a silicon oxide film 16 is provided. Above the conductive member 14, a silicon oxide film 17 is provided.

Above the silicon oxide film 17, a structural body 20 is provided. The structural body 20 includes a plurality of electrode films 21. The electrode film 21 is made of e.g. silicon doped with boron (boron-doped silicon). The electrode film 21 functions as a gate electrode of the memory cell transistor. The electrode film 21 is shaped like a strip extending along the X axis. The electrode films 21 are arranged like a matrix along the Y and Z axes.

Between two electrode films 21 adjacent along the Y axis, an insulating plate member 22 made of e.g. silicon oxide is provided. The insulating plate member 22 is shaped so as to penetrate through the structural body 20. The plurality of electrode films 21 are divided at the position where the insulating plate member 22 is provided. Alternatively, a hole may be formed at the position of dividing the plurality of electrode films 21, and an insulating film may be provided on the sidewall of the hole to constitute a hollow structure.

Above the structural body 20, a silicon oxide film 26 is provided. Above the silicon oxide film 26, a control electrode 27 is provided. The control electrode 27 is made of e.g. boron-doped silicon. The control electrode 27 extends along the X axis. The control electrode 27 is provided for each semiconductor pillar SP. The control electrode 27 is e.g. a select gate electrode SG.

In the structural body 20, the silicon oxide film 26, and the control electrode 27, a plurality of through holes 30 extending along the Z axis are formed. The plurality of through holes 30 are arranged like a matrix along the X and Y axes. The through holes 30 penetrate through the control electrode 27, the silicon oxide film 26, and the structural body 20 to both Y-axis end portions of the recess 15. Thus, a pair of through holes 30 adjacent along the Y axis communicate with each other via the recess 15 to constitute one U-shaped hole 31. Each through hole 30 is shaped like e.g. a cylinder. Each U-shaped hole 31 is shaped like a generally U-shape.

As shown in FIGS. 1 and 3, on the inner surface of the U-shaped hole 31, a block insulating film 35 is provided. The block insulating film 35 is a film that does not substantially pass a current even under application of voltage within the driving voltage range of the nonvolatile semiconductor storage device 110. The block insulating film 35 is made of a high dielectric material, such as a material (e.g., silicon oxide) having a higher dielectric constant than the material forming the charge accumulation film 36 described later.

As shown in FIG. 3, on the block insulating film 35, a charge accumulation film 36 is provided. The charge accumulation film 36 is a film for accumulating charge. The charge accumulation film 36 is a film including electron trap sites. The charge accumulation film 36 is made of e.g. silicon nitride film.

On the charge accumulation film 36, a tunnel insulating film 37 is provided. The tunnel insulating film 37 is a film being normally insulative, but passing a tunnel current upon application of a prescribed voltage within the driving voltage range of the nonvolatile semiconductor storage device 110. The tunnel insulating film 37 is made of e.g. silicon oxide. The memory film 33 includes a stacked film of the block insulating film 35, the charge accumulation film 36, and the tunnel insulating film 37.

In the U-shaped hole 31, a semiconductor layer 39 is embedded. The semiconductor layer 39 is made of polysilicon containing impurity (e.g., phosphorus). By embedding the semiconductor layer 39 in the U-shaped hole 31, a U-shaped pillar 38 is formed. The U-shaped pillar 38 is shaped like a U-shape reflecting the shape of the U-shaped hole 31.

The U-shaped pillar 38 is in contact with the tunnel insulating film 37. In the U-shaped pillar 38, the portion located in the through hole 30 constitutes a semiconductor pillar SP, and the portion located in the recess 15 constitutes a connecting member 40.

Of the plurality of semiconductor pillars SP, the semiconductor pillars SP aligned along the X axis in the same row penetrate through the same electrode film 21. Of the four semiconductor pillars SP (first semiconductor pillar SP1, second semiconductor pillar SP2, third semiconductor pillar SP3, and fourth semiconductor pillar SP4) included in two U-shaped pillars 38 adjacent along the Y axis, the inner two semiconductor pillars SP (second semiconductor pillar SP2 and third semiconductor pillar SP3) penetrate through the same electrode film 21. Of the above four semiconductor pillars SP, the outer two semiconductor pillars SP (first semiconductor pillar SP1 and fourth semiconductor pillar SP4) penetrate through the same electrode film 21. Alternatively, the semiconductor pillars SP may be provided so that each semiconductor pillar SP penetrates through a different electrode film 21.

As shown in FIG. 2, in the end portion Rmp of the memory array region Rm, part of the plurality of electrode films 21 is processed into a staircase pattern. More specifically, the plurality of electrode films 21 extend in the end portion Rmp. In each end portion of the plurality of electrode films 21, the height along the Z axis from the major surface 11a becomes lower with the distance from the central portion Rmc of the memory array region Rm. In the example shown in FIG. 2, with the distance from the central portion Rmc along the X axis, the above height of each end surface from the uppermost electrode film 21 to the lowermost electrode film 21 sequentially becomes lower. In the structural body 20, the portion in which part of the plurality of electrode films 21 is processed into a staircase pattern is referred to as staircase portion STP.

An insulating film 41 is provided on the side surface of the staircase portion STP, the side surface of the silicon oxide film 26, and the side surface of the control electrode 27. The insulating film 41 is made of e.g. silicon nitride. The insulating film 41 is formed in a staircase pattern reflecting the shape of the staircase portion STP. Above the control electrode 27 and above the insulating film 41, an interlayer insulating film 72 made of e.g. silicon oxide is provided. The structural body 20 is embedded in the interlayer insulating film 72.

In the interlayer insulating film 72, plugs 43 and contacts 44 and 45 are embedded. The plug 43 is placed immediately above the semiconductor pillar SP and connected to the semiconductor pillar SP. The contact 44 is placed immediately above one X-axis end portion of the control electrode 27 and connected to the control electrode 27. The contact 45 is placed immediately above one X-axis end portion of the electrode film 21 and connected to the electrode film 21.

Above the plugs 43 and the contacts 44 and 45 in the interlayer insulating film 72, source lines 47, plugs 48, and wirings 49 and 50 are embedded. The source line 47 extends along the X axis and is connected via a plug 43 to one of a pair of semiconductor pillars SP belonging to the U-shaped pillar 38. The plug 48 is connected via a plug 43 to the other of the pair of semiconductor pillars SP belonging to the U-shaped pillar 38. The wirings 49 and 50 extend along the Y axis and are connected to the contacts 44 and 45, respectively.

Above the interlayer insulating film 72, bit lines 51 extending along the Y axis are provided and connected to the plugs 48. Furthermore, above the interlayer insulating film 72, a wiring 52 is provided and connected to the wiring 49 via a plug 53. Above the interlayer insulating film 72, a silicon nitride film 54 and an interlayer insulating film 55 are provided so as to embed the bit lines 51 and the wiring 52. Prescribed wirings and the like are embedded therein.

As shown in FIG. 2, in the peripheral circuit region Rc, in the upper portion of the substrate 11, transistors 61 and the like are formed. Above the substrate 11, the interlayer insulating film 72, the silicon nitride film 54, and the interlayer insulating film 55 are provided. Inside the peripheral circuit region Rc, prescribed wirings and the like are embedded.

Next, the recess 141 of the conductive member 14 is described in detail.

Figure 4:
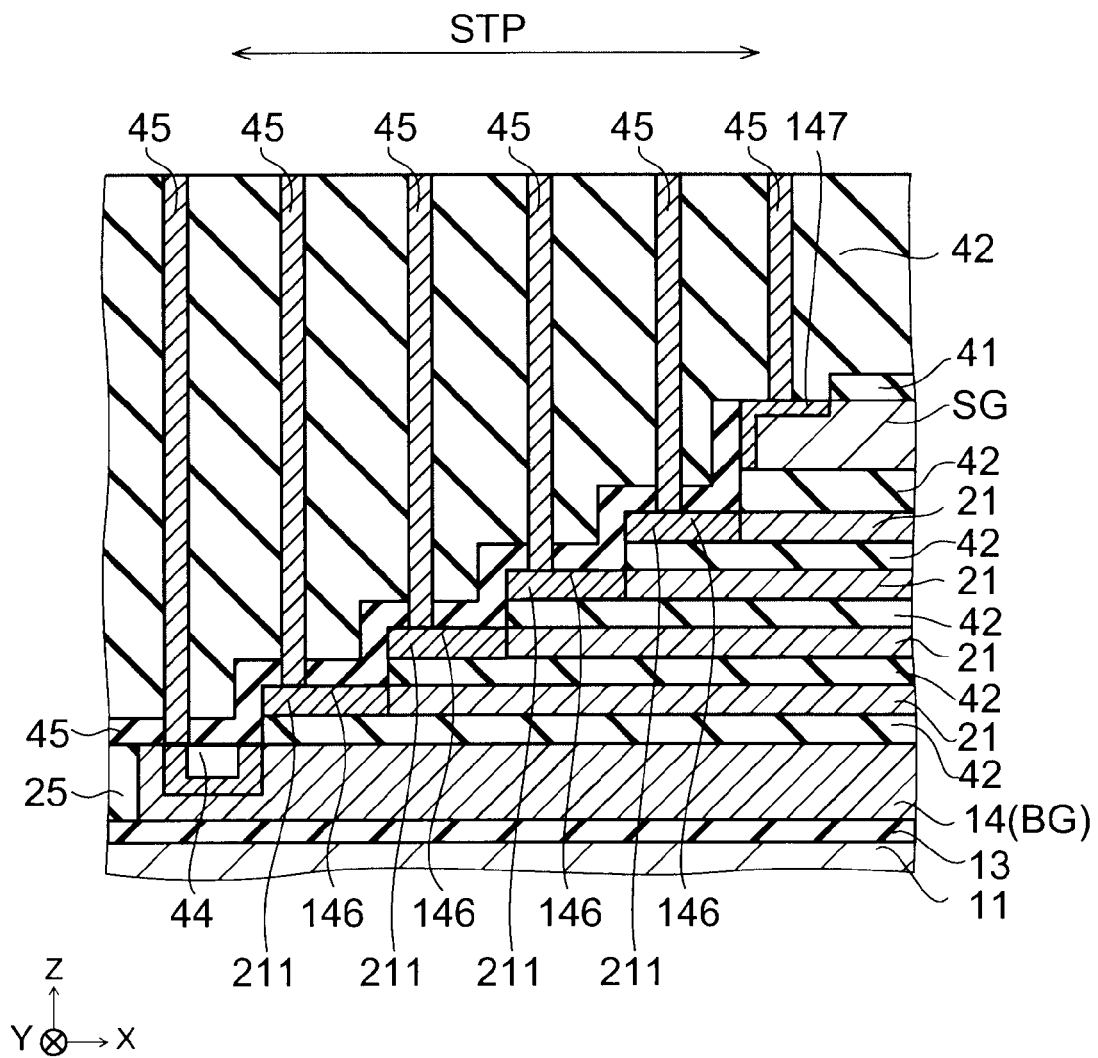
FIG. 4 is a schematic sectional view illustrating a configuration of a staircase portion and a recess.

FIG. 4 is a schematic sectional view illustrating the configuration of the staircase portion and the recess.

The recess 141 is provided in the portion of the conductive member 14 extending outside the staircase portion STP (e.g., outside along the X axis). The recess 141 is formed by removing part of the conductive member 14 when forming the staircase portion STP. Thus, the recess 141 is juxtaposed with the staircase portion STP in the conductive member 14.

The recess 141 includes e.g. a portion provided parallel to at least part of the outline of the staircase portion STP as viewed along the Z axis.

The recess 141 is shaped like e.g. a trench extending along the major surface 11a. Besides the trench shape, the recess 141 may be shaped like a depression not extending in any particular direction.

In the recess 141, a first silicide portion 145 is provided. The first silicide portion 145 is provided e.g. on the inner wall of the recess 141. The first silicide portion 145 is formed by heat treating a metal film (such as Ni, Co, and Ti) formed in the recess 141. The first silicide portion 145 includes a metal compound produced by reaction between the metal film and the silicon contained in the conductive member 14 by heat treatment.

The first silicide portion 145 is thus provided in the recess 141. Hence, the electrical resistance of the conductive member 14 is made lower than the electrical resistance of the conductive member not provided with the first silicide portion 145. Thus, the electrical resistance of the back gate electrode BG being the conductive member 14 is made lower. This improves the controllability of the memory cells MC by the back gate electrode BG.

Part of the plurality of electrode films 21 may include a second silicide portion 146. Like the first silicide portion 145, the second silicide portion 146 is formed by silicidizing a metal film (such as Ni, Co, and Ti) formed on the electrode film 21 by heat treatment.

For instance, the second silicide portion 146 is provided in each end portion 211 of the plurality of electrode films 21.

The contact 45 is connected to the electrode film 21 via the second silicide portion 146. This reduces the contact resistance between the contact 45 and the electrode film 21.

Figure 5A:
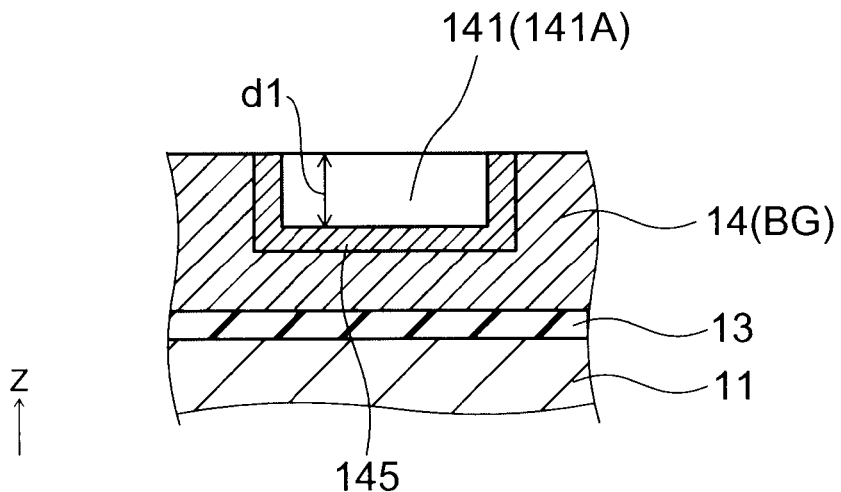
FIGS. 5A to 5C are schematic sectional views illustrating a shape of the recess.
Figure 5B:
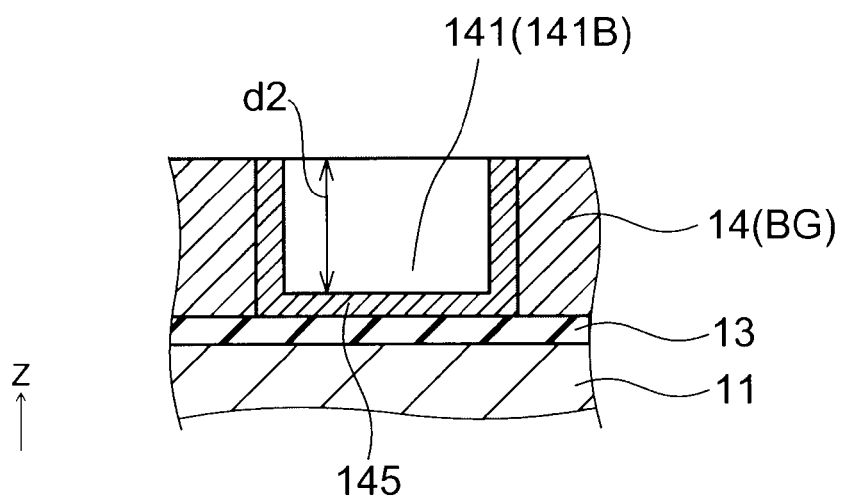
Figure 5C:
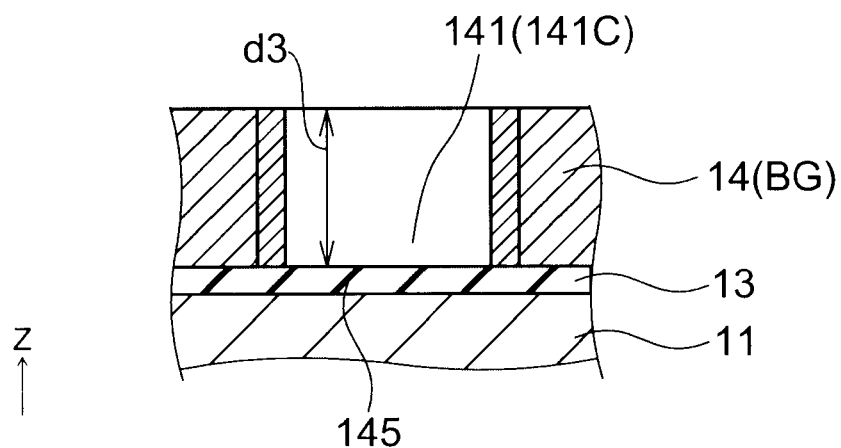

FIGS. 5A to 5C are schematic sectional views illustrating the shape of the recess.

FIGS. 5A to 5C show the cross-sectional shape of the recess 141.

The recess 141A shown in FIG. 5A has a depth d1 along the Z axis. The first silicide portion 145 is provided along the inner wall of the recess 141A. The conductive member 14 is left between the bottom of the recess 141A and the silicon oxide film 13 on the substrate 11 side.

The recess 141B shown in FIG. 5B has a depth d2 along the Z axis. The depth d2 is deeper than the depth d1 (see FIG. 5A). The first silicide portion 145 is provided along the inner wall of the recess 141B. The conductive member 14 is not left between the bottom of the recess 141B and the silicon oxide film 13 on the substrate 11 side. That is, the portion between the bottom of the recess 141B and the silicon oxide film 13 is entirely silicidized.

The recess 141C shown in FIG. 5C is a through hole penetrating through the conductive member 14 along the Z axis. The first silicide portion 145 is provided along the sidewall of the recess 141C.

In any of the recesses 141A, 141B, and 141C, a different member may be embedded inside.

Figure 6A:
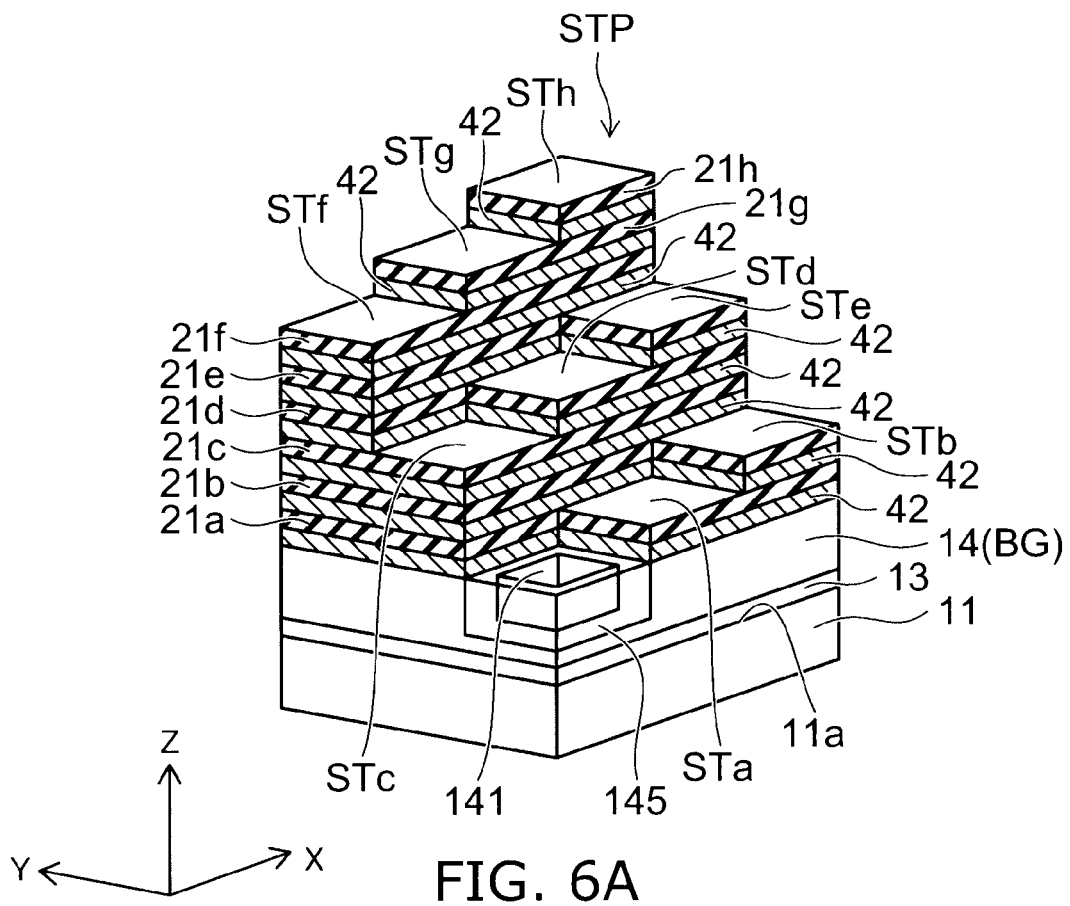
FIGS. 6A and 6B are schematic views showing an alternative example of the staircase portion and the recess.
Figure 6B:
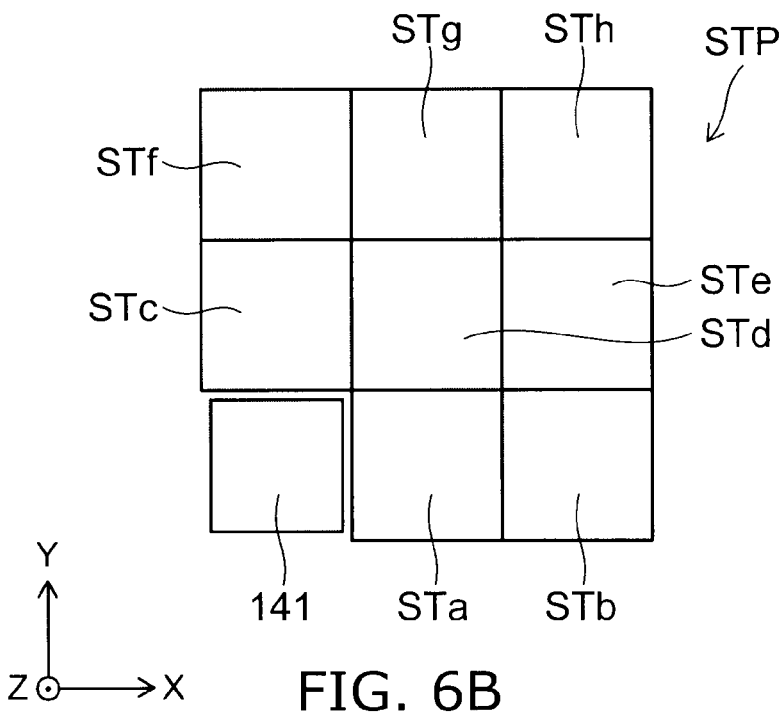

FIGS. 6A and 6B are schematic views showing an alternative example of the staircase portion and the recess.

FIG. 6A shows a schematic perspective view of the alternative example of the staircase portion. FIG. 6B shows a schematic plan view of the alternative example of the staircase portion.

In the staircase portion STP shown in FIGS. 6A and 6B, part of the plurality of electrode films 21 is provided with a staircase pattern along the X and Y axes.

That is, the height from the major surface 11a along the Z axis of the step surface provided in each end portion of the plurality of electrode films 21 sequentially changes along the X axis, and sequentially changes also along the Y axis.

In the example shown in FIGS. 6A and 6B, upward from the major surface 11a of the substrate 11, eight electrode films 21a-21h are stacked. The step surfaces STa-STh of the electrode films 21a-21h are provided like a matrix in the X-axis and Y-axis directions as viewed along the Z axis. The height from the major surface 11a of each step surface STa-STh is made higher in the order of the step surfaces STa-STh. The difference in the height of the step surfaces STa-STh is equal to e.g. the thickness of the interlayer insulating film 42 provided between the corresponding electrode films 21a-21h.

In the structure of the staircase portion STP including a plurality of electrode films 21a-21h provided with the step surfaces STa-STh as described above, a recess 141 is provided in the conductive member 14 exposed at the position adjacent to the step surface STa of the lowermost electrode film 21a. That is, as viewed along the Z axis, the recess 141 is provided at the position adjacent to the step surfaces STa and STc. The recess 141 is formed like a depression.

A first silicide portion 145 is provided along the inner wall of this recess 141.

In FIGS. 6A and 6B, the staircase portion STP made of eight electrode films 21a-21h is illustrated. However, the same also applies to the case where the number of electrode films 21 is other than eight.

In the nonvolatile semiconductor storage device 110 according to the embodiment, a recess 141 is provided in the conductive member 14 used as a back gate electrode BG. A first silicide portion 145 is provided in this recess 141. Thus, the resistance of the back gate electrode BG is decreased. By decreasing the resistance of the back gate electrode BG, the controllability of the memory cells MC by the back gate electrode BG is improved.

(Second Embodiment)

The second embodiment is an example of the method for manufacturing a nonvolatile semiconductor storage device.

Figure 7:
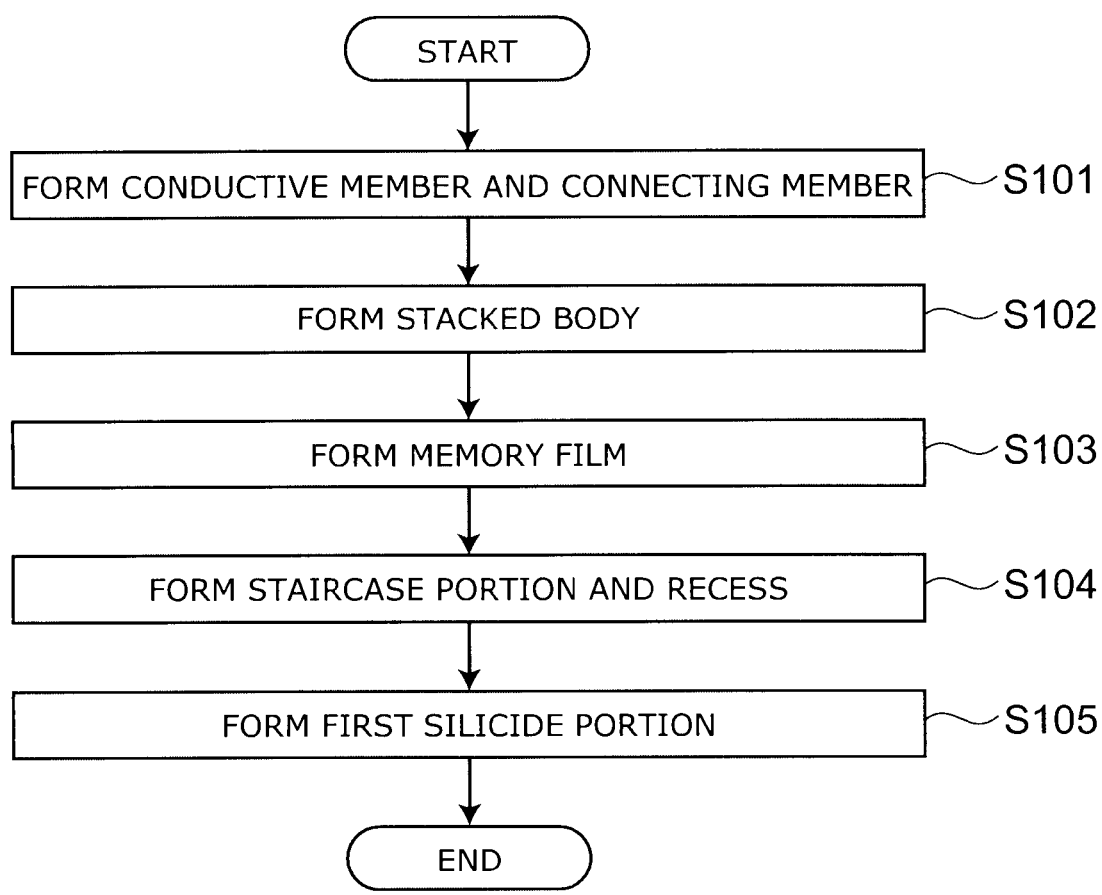
FIG. 7 is a flow chart illustrating a method for manufacturing a nonvolatile semiconductor storage device.

FIG. 7 is a flow chart illustrating the method for manufacturing a nonvolatile semiconductor storage device.

As shown in FIG. 7, this manufacturing method includes forming a conductive member and a connecting member (step S101), forming a structural body (step S102), forming a memory film (step S103), forming a staircase portion and a recess (step S104), and forming a first silicide portion (step S105).

FIGS. 8A to 15B are schematic sectional views illustrating the method for manufacturing a nonvolatile semiconductor storage device.

FIGS. 8A to 15B illustrate schematic sectional views focused on the staircase portion.

Figure 8A:
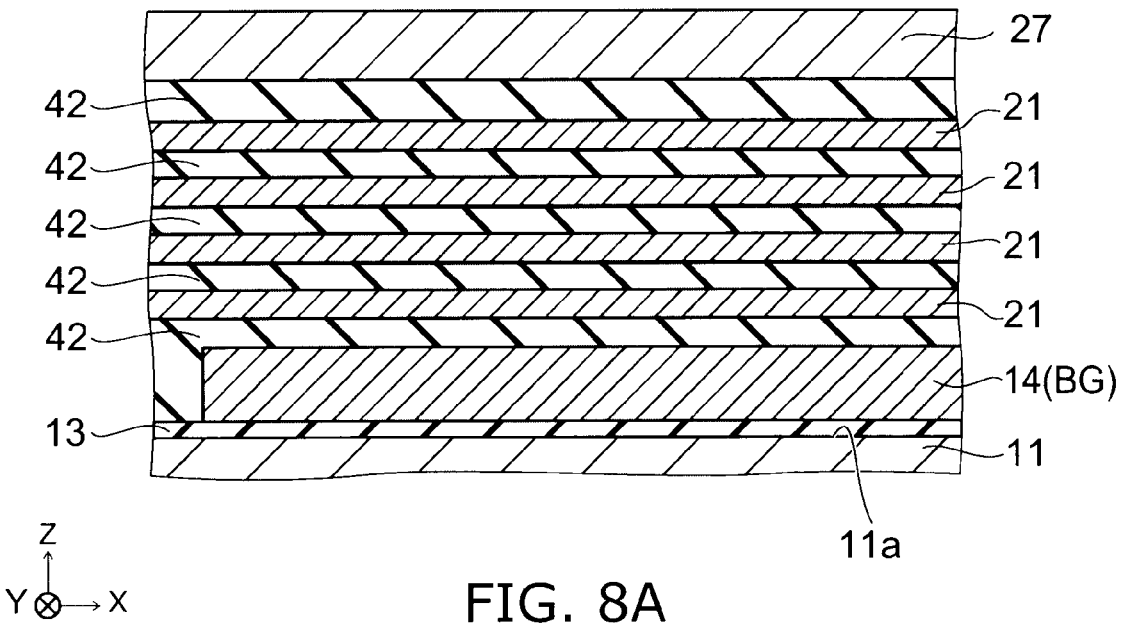
FIGS. 8A to 15B illustrate schematic sectional views focused on the staircase portion.

First, as shown in FIG. 8A, a conductive member 14 is formed along the major surface 11a of a substrate 11. The conductive member 14 is made of e.g. silicon doped with impurity and being conductive. The conductive member 14 is formed by e.g. the CVD (chemical vapor deposition) method. The conductive member 14 is formed above a silicon oxide film 13 provided on the major surface 11a of the substrate 11. The conductive member 14 is a film constituting a back gate electrode BG.

Next, above the conductive member 14, a structural body 20 is formed. Specifically, the conductive member 14 is patterned. Then, above the conductive member 14, boron-doped polysilicon layers doped with e.g. boron and constituting electrode films 21 are alternately stacked layer by layer with non-doped polysilicon layers. Next, a hole penetrating through the stacked film is formed. Via this hole, the non-doped polysilicon layers are removed by etching. Then, in the portion where the non-doped polysilicon layers have been removed, silicon oxide films constituting interlayer insulating films 42 are embedded. Above the uppermost interlayer insulating film 42, a control electrode 27 constituting a select gate electrode SG is formed. The control electrode 27 is made of e.g. silicon doped with impurity and being conductive.

After forming this structural body 20, the memory cell array region is subjected to the step for forming e.g. semiconductor pillars SP, memory cells MC, drain side select transistors, source side select transistors, and back gate transistors.

Figure 8B:
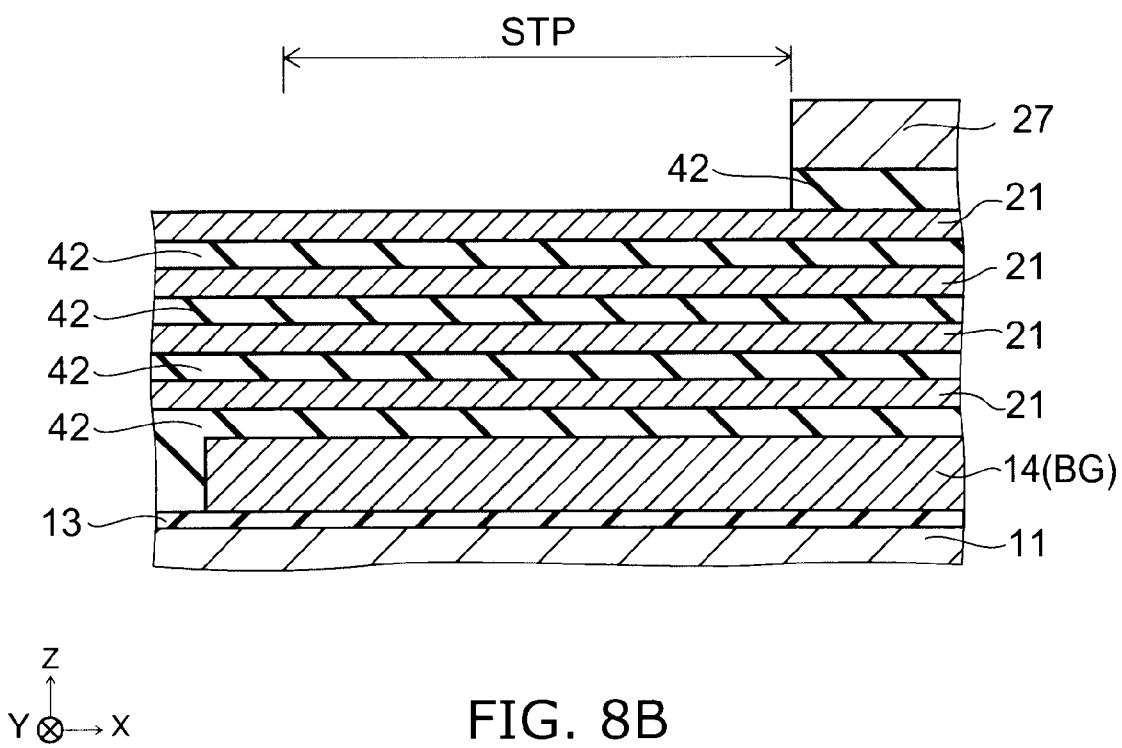

Then, as shown in FIG. 8B, in the region where the staircase portion STP is to be formed, a resist mask, not shown, is formed. Then, the interlayer insulating film 42 below the control electrode 27 is selectively removed and patterned.

Figure 9A:
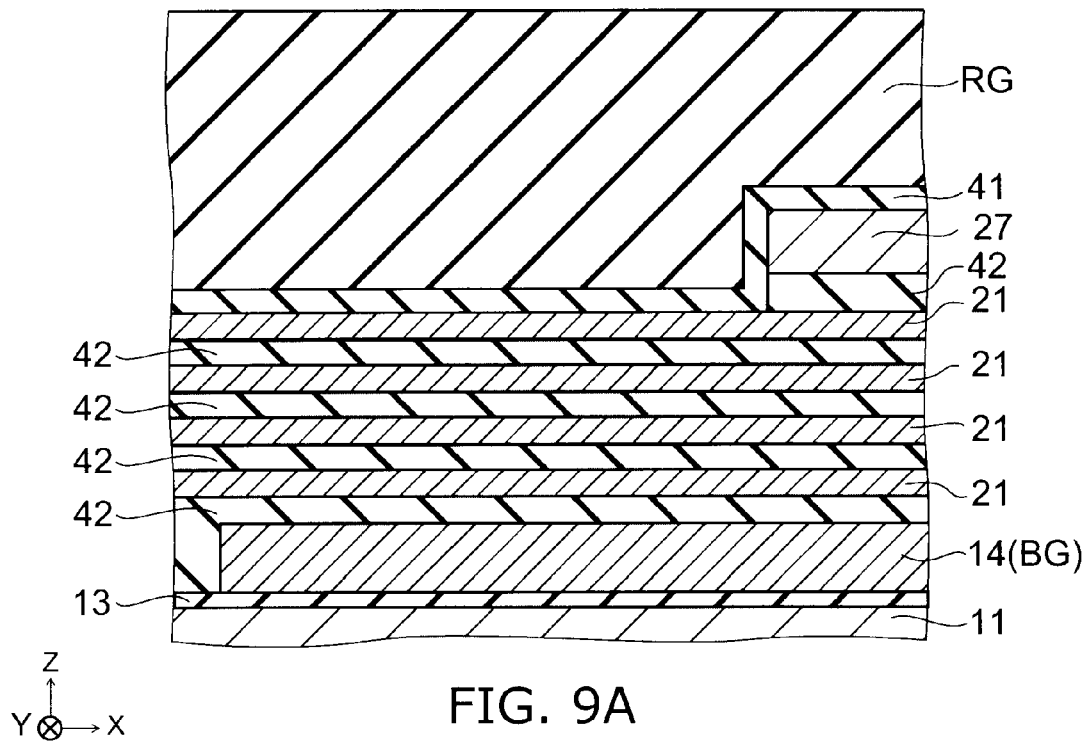

Subsequently, as shown in FIG. 9A, an insulating film (e.g., silicon oxide layer) 41 covering the upper surface of the structural body 20 is formed. Then, above the insulating film 41, a resist film RG is formed.

Figure 9B:
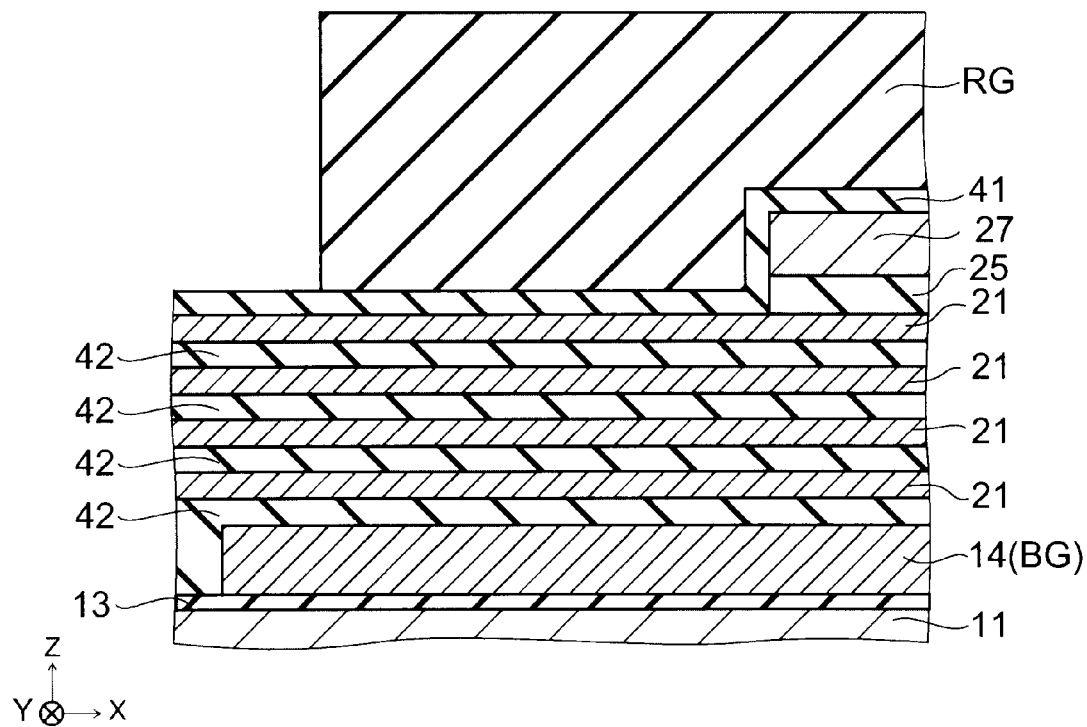

Next, the resist film RG is subjected to lithography and development using a mask, not shown. Thus, as shown in FIG. 9B, the resist film RG is patterned so that its end is located at a desired position.

Figure 10A:
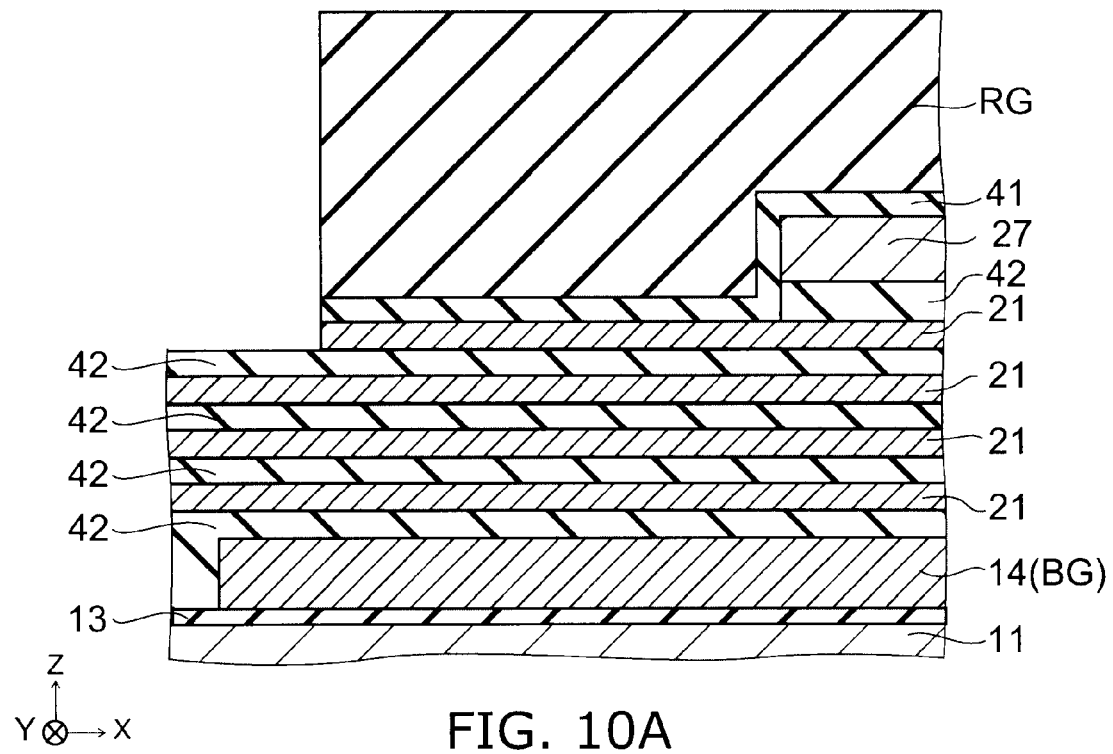

Next, the resist film RG is used as a mask to perform RIE (reactive ion etching) to remove the portion of the insulating film 41 and the electrode film 21 therebelow exposed from the resist film RG. Thus, as shown in FIG. 10A, part of the insulating film 41 not covered with the resist film RG and part of one electrode film 21 therebelow are removed.

Figure 10B:
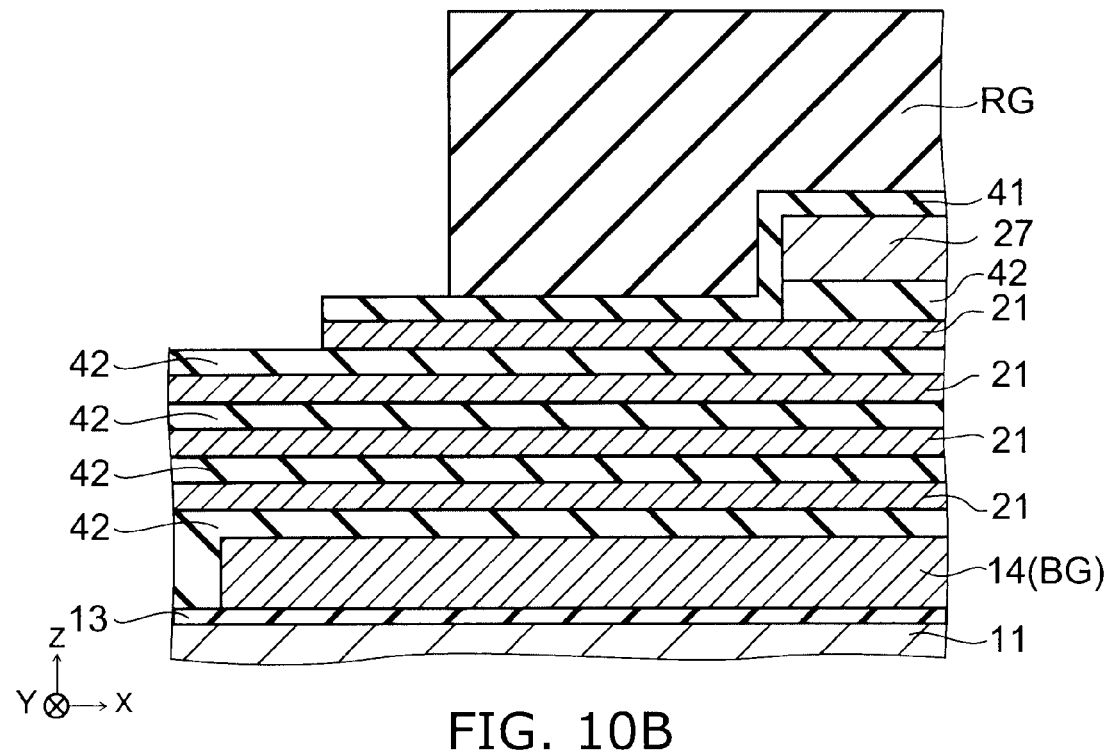

Next, resist slimming for reducing the planar size of the resist film RG is performed. By this resist slimming, as shown in FIG. 10B, part of the surface of the insulating film 41 is newly exposed.

Figure 11A:
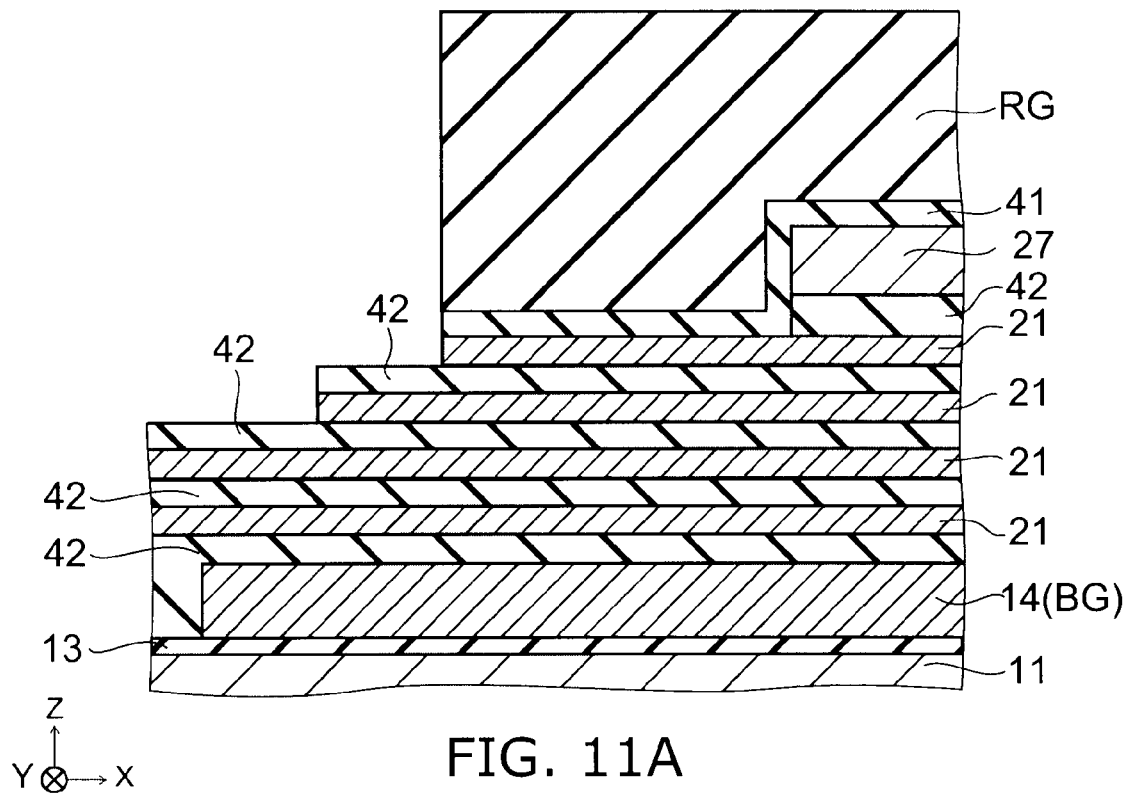

Then, the slimmed resist film RG is used as a mask to perform RIE. Thus, as shown in FIG. 11A, the interlayer insulating film 42 below the portion of the electrode film 21 removed by the previous etching and the electrode film 21 therebelow are removed. Simultaneously, in the adjacent portion, the interlayer insulating film 42 exposed from the resist film RG and the electrode film 21 therebelow are also removed.

Figure 11B:
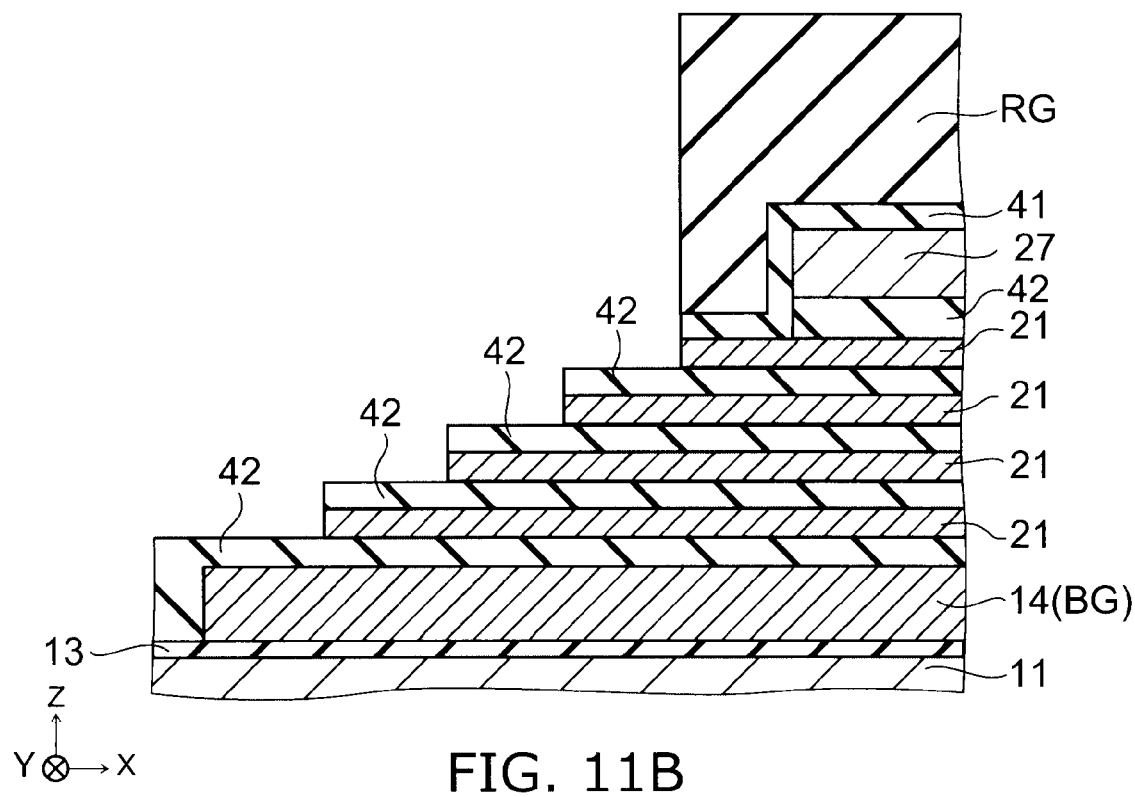

Subsequently, likewise, the step for slimming the resist film RG is performed. This is followed by the step for etching the portion of one insulating film 41 not covered with but exposed from the slimmed resist film RG and one electrode film 21 therebelow, and one interlayer insulating film 42 exposed from the resist film RG in the adjacent portion and one electrode film 21 therebelow. By repeating these steps, a staircase structure shown in FIG. 11B is obtained.

Figure 12A:
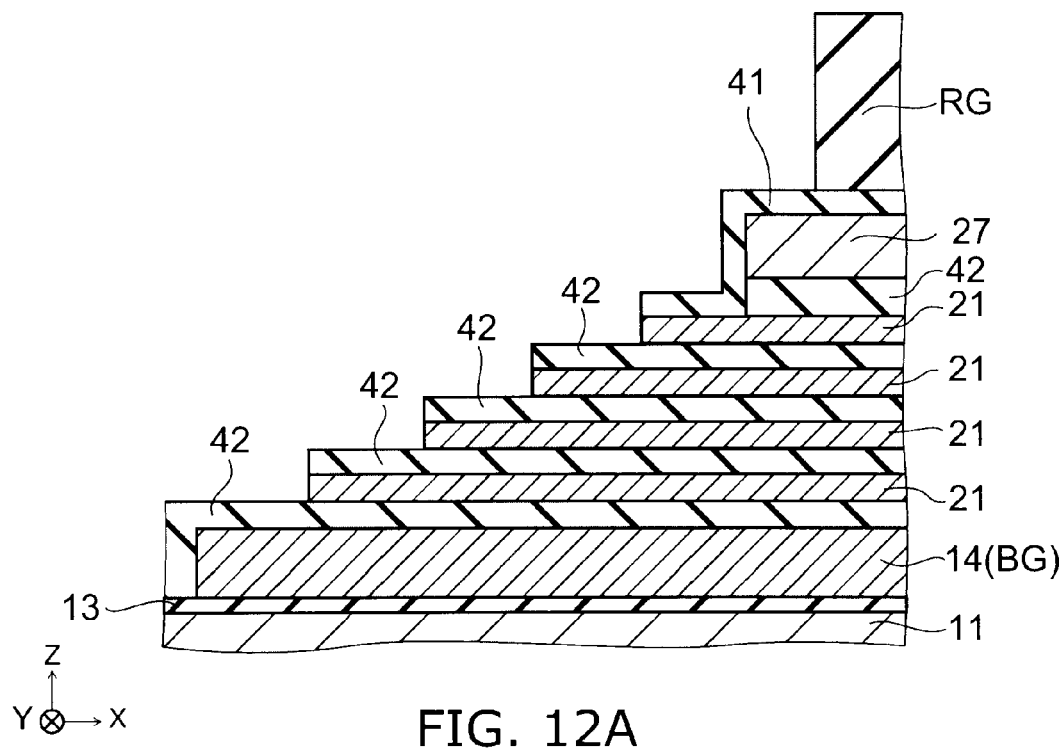
Figure 12B:
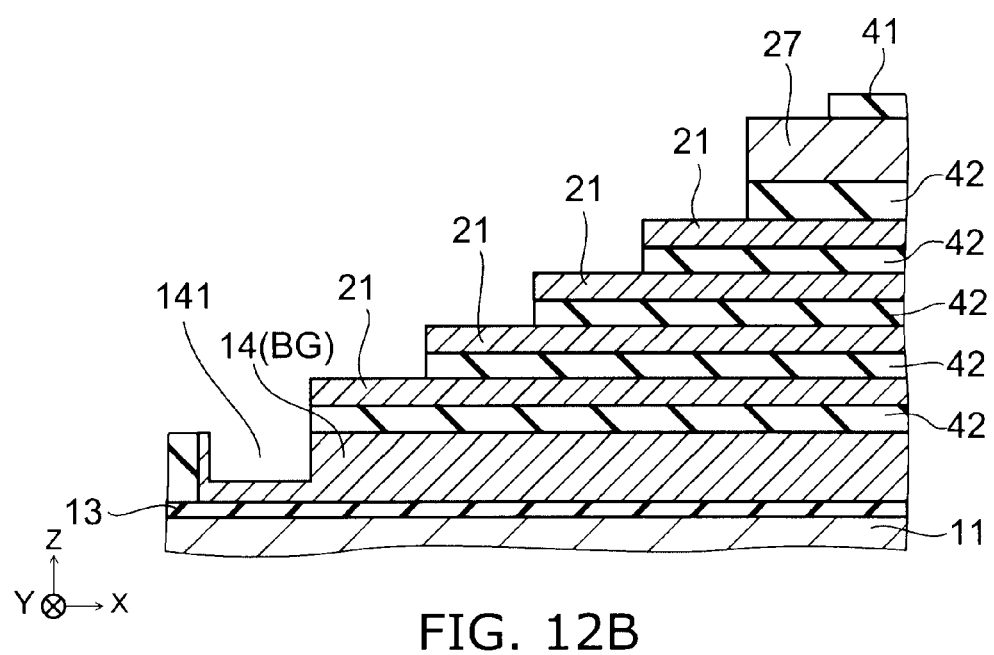

Then, as shown in FIG. 12A, the resist film RG is further slimmed, and the remaining resist film RG is used as a mask to perform etching. Thus, the insulating film 41 and the interlayer insulating film 42 covering the surface of the staircase structure portion are removed. As shown in FIG. 12B, after this etching, part of the electrode film 21 and part of the conductive member 14 are exposed. Furthermore, in the conductive member 14 adjacent to the staircase portion STP, a recess 141 is formed. The recess 141 is formed in the step for forming the staircase structure of the staircase portion STP.

Figure 13A:
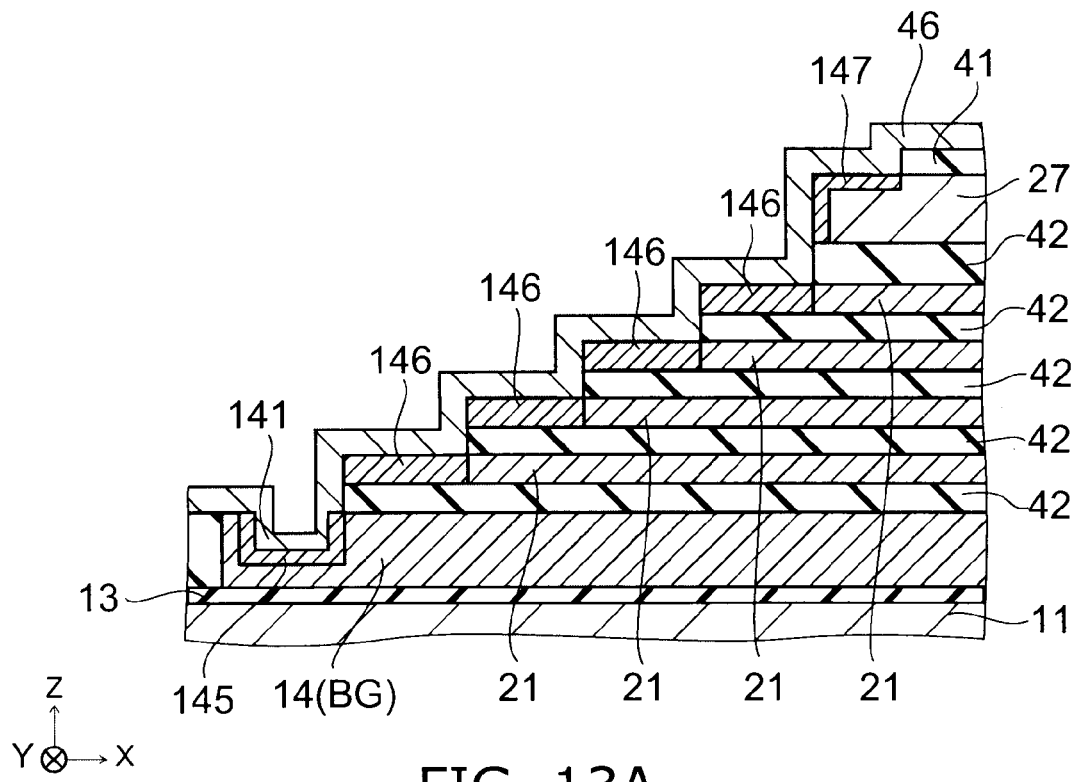

Next, as shown in FIG. 13A, the staircase structure portion is covered with a metal film 46. The metal film 46 is formed by e.g. the sputtering method. In the embodiment, the material of the metal film 46 is e.g. titanium (Ti). However, besides titanium, the metal film 46 may be made of e.g. cobalt (Co), nickel (Ni), tantalum (Ta), platinum (Pt), palladium (Pd), or tungsten (W).

After forming the metal film 46, annealing treatment (heat treatment) is performed to react the silicon contained in the control electrode 27, the electrode film 21, and the conductive member 14 with the titanium contained in the metal film 46. Thus, titanium silicide (first silicide portion 145) is formed in the portion of the inner wall of the recess 141 of the conductive member 14 in contact with the metal film 46.

Furthermore, titanium silicide (second silicide portion 146) is formed in the end portion of the electrode film 21 in contact with the metal film 46. Furthermore, titanium silicide (third silicide portion 147) is formed in the end portion of the control electrode 27 in contact with the metal film 46.

In this step, in the central portion Rmc of the memory array region Rm shown in FIG. 2, a silicide portion such as titanium silicide may be formed in the end portion of the electrode film 21 (the end portion of the electrode film 21 exposed by division of the electrode film 21).

Figure 13B:
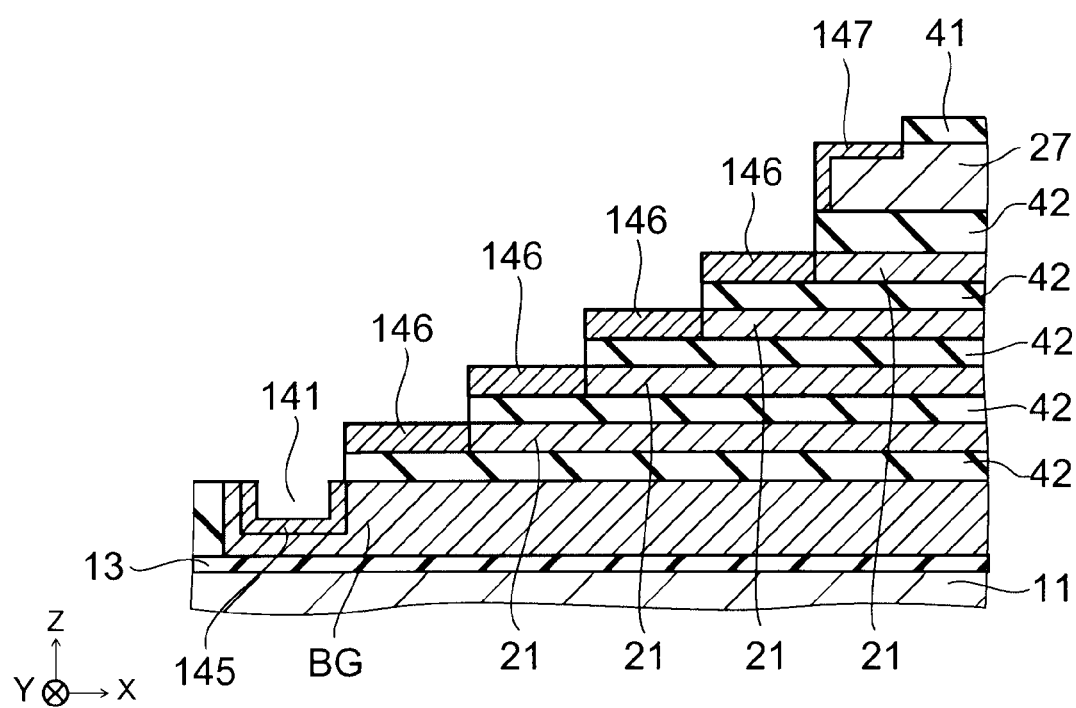

Then, the unreacted portion of the metal film 46 is removed by wet processing. Thus, as shown in FIG. 13B, the titanium silicide in each step (first silicide portion 145, second silicide portion 146, and third silicide portion 147) is exposed.

Figure 14A:
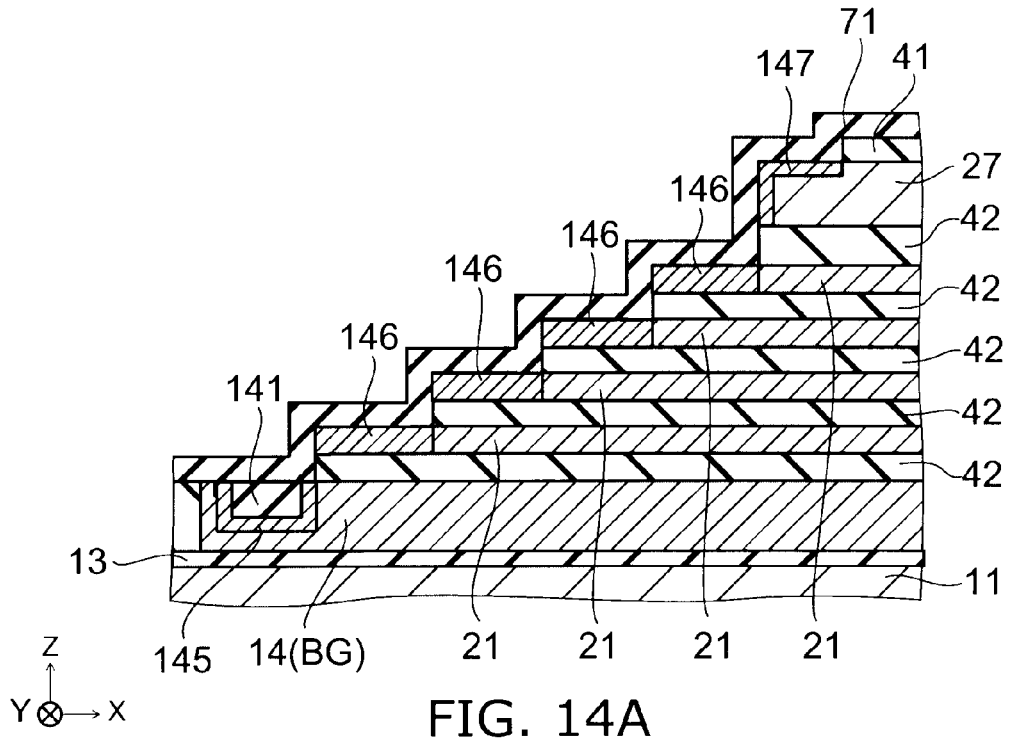
Figure 14B:
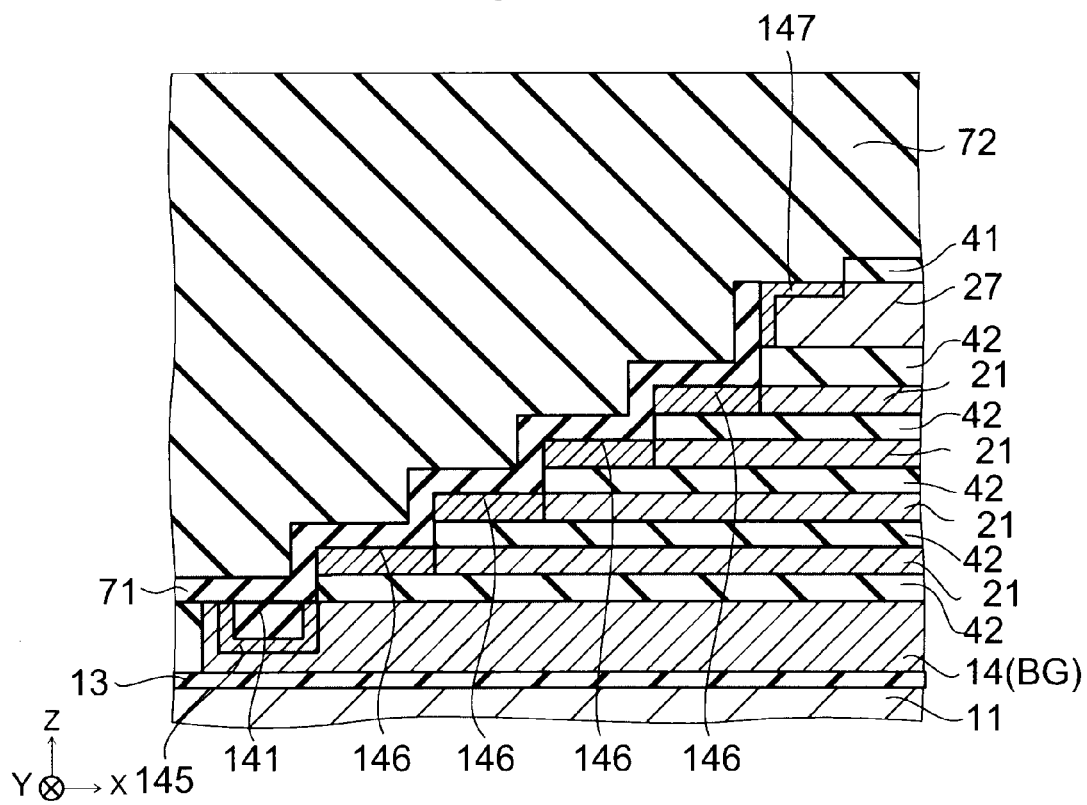

Next, as shown in FIG. 14A, a stopper layer 71 is formed so as to cover the staircase structure portion. The stopper layer 71 is made of e.g. silicon nitride. The stopper layer 71 may be provided along the wall surface of the recess 141, or so as to fill the recess 141. Subsequently, the stopper layer 71 above the control electrode 27 is selectively removed. Then, as shown in FIG. 14B, an interlayer insulating film 72 is formed above the stopper layer 71 and above the control electrode 27. The interlayer insulating film 72 is made of e.g. silicon oxide.

Subsequently, the upper surface of the interlayer insulating film 72 is planarized. Then, a mask made of e.g. an organic film, not shown, is formed thereabove, and used as a mask to selectively etch the interlayer insulating film 72 and the stopper layer 71.

Figure 15A:
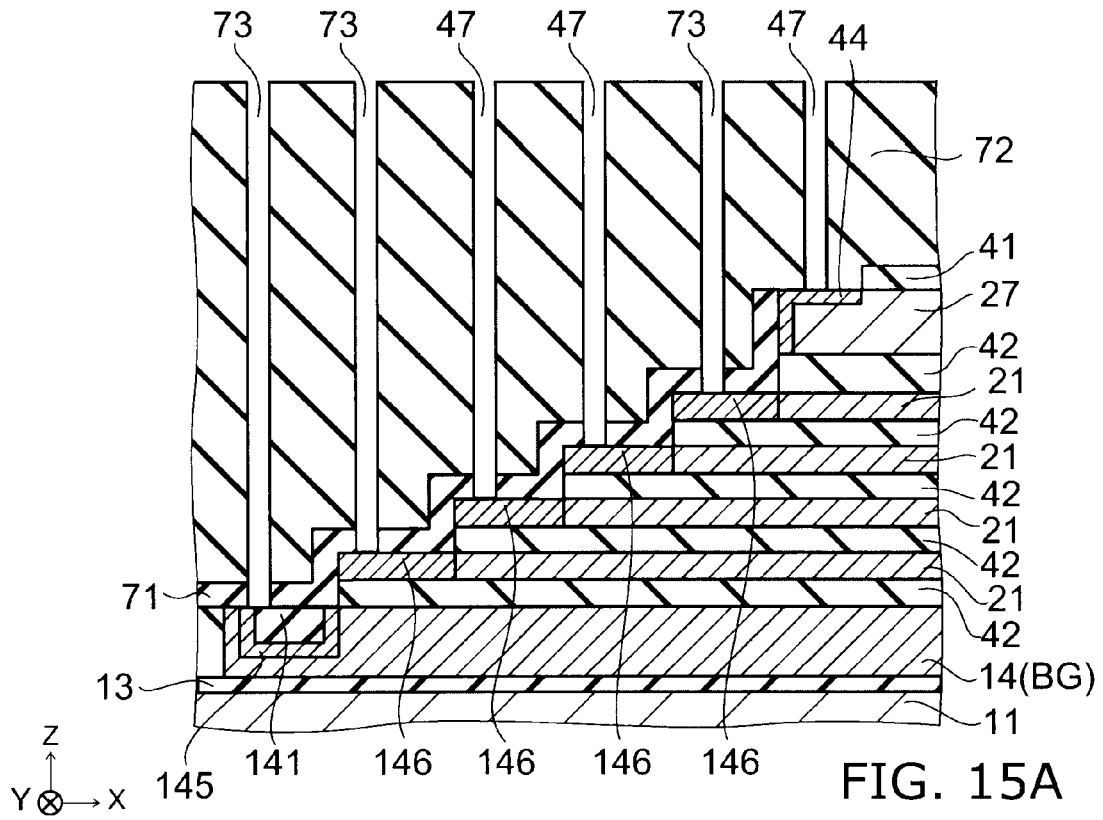

Thus, as shown in FIG. 15A, a plurality of contact holes 73 are formed in the interlayer insulating film 72 and the stopper layer 71. The plurality of contact holes 73 are different from each other in the depth from the upper surface of the interlayer insulating film 72. The contact holes 73 penetrate through the interlayer insulating film 72 and the stopper layer 71 to the titanium silicide (first silicide portion 145, second silicide portion 146, and third silicide portion 147) formed in the upper surface of the control electrode 27, the electrode film 21, and the conductive member 14.

The plurality of contact holes 73 are formed simultaneously and collectively by RIE (reactive ion etching). The silicon layers (control electrode 27, electrode film 21, and conductive member 14) in the contact region are processed into a staircase pattern so as to become longer downward. Thus, the plurality of contact holes 73 reaching the silicon layers can be collectively formed by the same etching process. This makes the process efficient.

At this time, the stopper layer 71 made of silicon nitride functions as an etching stopper in etching the interlayer insulating film 72 made of silicon oxide. The titanium silicide at the surface of each step (first silicide portion 145, second silicide portion 146, and third silicide portion 147) functions as an etching stopper in etching the stopper layer 71.

Figure 15B:
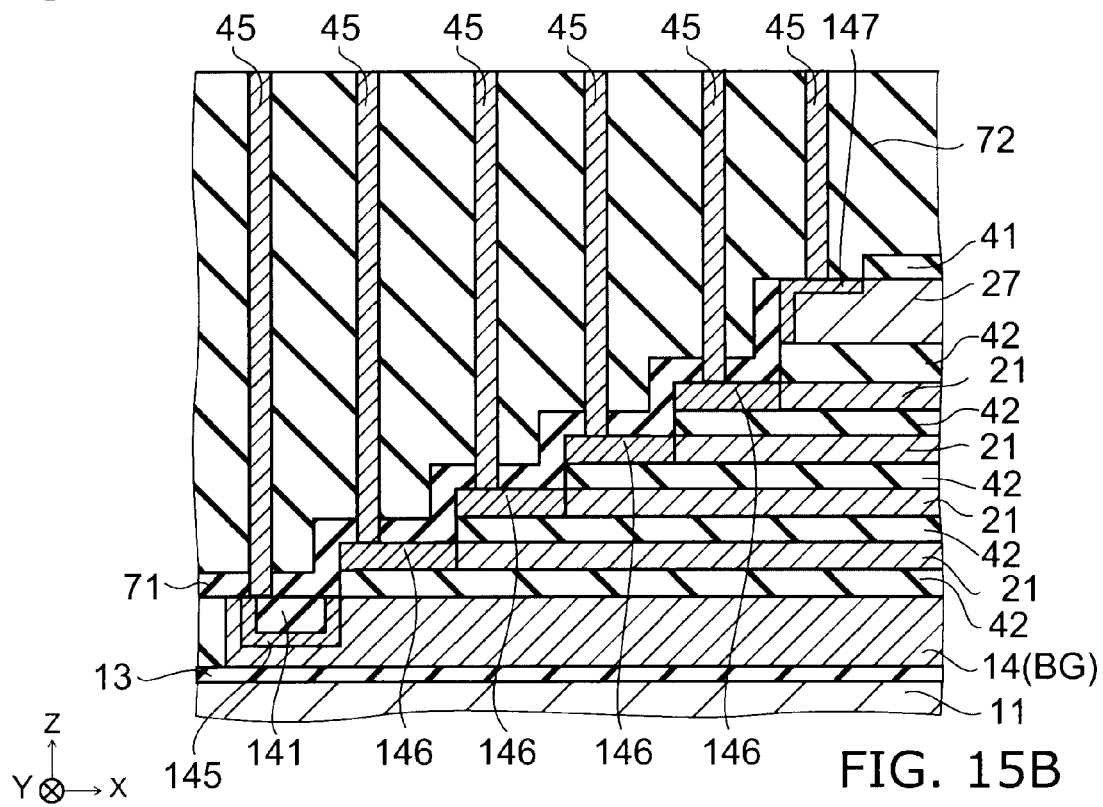

After forming the contact holes 73, as shown in FIG. 15B, a contact 45 is formed inside the contact hole 73. After forming the contacts 45, as shown in FIG. 2, various wirings (source lines 47, plugs 48, and wirings 49 and 50) and the like above the contacts 45 are formed. Thus, the nonvolatile semiconductor storage device 110 is completed.

In the method for manufacturing a nonvolatile semiconductor storage device according to the embodiment, the recess 141 is formed in the step for forming the staircase shape in the staircase portion STP. Hence, there is no need to form the recess 141 in a separate step. This suppresses the increase of manufacturing steps of the nonvolatile semiconductor storage device 110 including the recess 141. Furthermore, the first silicide portion 145 is provided in the recess 141. Hence, the area of silicide is made larger than in the case where silicide is formed on the plane. This decreases the electrical resistance of the back gate electrode BG being the conductive member 14 and improves the controllability of the memory cells MC.

As described above, the embodiments can provide a nonvolatile semiconductor storage device and a method for manufacturing the same in which the controllability of memory cells is improved.

The embodiments and the variations thereof have been described above. However, the invention is not limited to these examples. For instance, those skilled in the art can modify the above embodiments or the variations thereof by suitable addition, deletion, and design change of components, and by suitable combination of the features of the embodiments. Such modifications are also encompassed within the scope of the invention as long as they fall within the spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor storage device comprising:
    a structural body provided above a memory region of a substrate including the memory region and a non-memory region, the structural body including a plurality of electrode films stacked along a first axis perpendicular to a major surface of the substrate;
    a plurality of semiconductor layers penetrating through the structural body along the first axis;
    a memory film provided between the plurality of electrode films and the semiconductor layer;
    a connecting semiconductor member provided between the substrate and the structural body and connected to respective end portions of two adjacent ones of the semiconductor layers; and
    a conductive member provided between the substrate and the connecting semiconductor member, extending from the memory region to the non-memory region, including a recess provided above the non-memory region, and including a first silicide portion provided in the recess, and the connecting semiconductor member being provided on the conductive member via an insulating film.

2. The device according to claim 1, wherein the plurality of electrode films include a second silicide portion provided in each end portion of the plurality of electrode films.

3. The device according to claim 2, further comprising:
    a contact connected to the second silicide portion and extending along the first axis.

4. The device according to claim 1, wherein
    the plurality of electrode films extend in the non-memory region and have an end portion in a staircase pattern, and
    the recess is juxtaposed with the structural body as viewed along the first axis.

5. The device according to claim 1, wherein height from the major surface of each end portion of the plurality of electrode films is sequentially made lower along a second axis perpendicular to the first axis.

6. The device according to claim 1, wherein height from the major surface of each end portion of the plurality of electrode films is sequentially made lower along a second axis perpendicular to the first axis, and sequentially made lower along a third axis perpendicular to the first axis and the second axis.

7. The device according to claim 1, wherein the first silicide portion is formed on an inner wall of the recess.

8. The device according to claim 1, wherein the recess is shaped like a trench provided along the major surface.

9. The device according to claim 1, wherein the recess is shaped like a depression.

10. The device according to claim 1, wherein the recess is a through hole penetrating through the conductive member along the first axis.

11. The device according to claim 1, wherein the memory film includes a block insulating film, a charge accumulation film, and a tunnel insulating film.

12. A method for manufacturing a nonvolatile semiconductor storage device, comprising:
    forming a conductive member along a major surface of a substrate and forming a connecting semiconductor member via an insulating film above the conductive member;
    forming a structural body above the conductive member and the connecting semiconductor member by stacking a plurality of electrode films along a first axis perpendicular to the major surface;
    forming a plurality of semiconductor layers penetrating through the structural body along the first axis, respective end portions of two adjacent ones of the semiconductor layers being connected via the connecting semiconductor member;
    forming a memory film between the plurality of electrode films and the semiconductor layer;
    forming a staircase portion by shaping part of the plurality of electrode films into a staircase pattern, and forming a recess in a portion of the conductive member extending outside the staircase portion in forming the staircase portion; and
    forming a first silicide portion in the recess.

13. The method according to claim 12, wherein forming the first silicide portion includes:
    forming a second silicide portion in each end portion of the plurality of electrode films.

14. The method according to claim 13, further comprising:
    forming a contact connected to the second silicide portion and extending along the first axis.

15. The method according to claim 12, wherein in forming the staircase portion, the staircase portion is formed so that height from the major surface of each end portion of the plurality of electrode films is sequentially made lower along a second axis perpendicular to the first axis.

16. The method according to claim 12, wherein in forming the staircase portion, the staircase portion is formed so that height from the major surface of each end portion of the plurality of electrode films is sequentially made lower along a second axis perpendicular to the first axis, and sequentially made lower along a third axis perpendicular to the first axis and the second axis.

17. The method according to claim 12, comprising forming the first silicide portion on an inner wall of the recess.

18. The method according to claim 12, comprising forming the recess shaped like a trench provided along the major surface.

19. The method according to claim 12, comprising forming the recess including a through hole penetrating through the conductive member along the first axis.

20. The method according to claim 12, comprising forming the memory film including a block insulating film, a charge accumulation film, and a tunnel insulating film.

* * * * *